United States Patent
Lee et al.

(10) Patent No.: US 11,996,857 B2
(45) Date of Patent: May 28, 2024

(54) ANALOG-TO-DIGITAL CONVERSION CIRCUIT AND RECEIVER INCLUDING SAME

(71) Applicant: SAMSUNG ELECTRONICS CO., LTD., Suwon-si (KR)

(72) Inventors: Sungno Lee, Hwaseong-si (KR); Heechang Hwang, Seoul (KR); Yongki Lee, Suwon-si (KR); Kyoungjun Moon, Hwaseong-si (KR); Hyochul Shin, Seoul (KR); Michael Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 181 days.

(21) Appl. No.: 17/827,135

(22) Filed: May 27, 2022

(65) Prior Publication Data
US 2022/0385297 A1   Dec. 1, 2022

(30) Foreign Application Priority Data
May 31, 2021   (KR) .......................... 10-2021-0070108

(51) Int. Cl.
*H03M 1/10*   (2006.01)
(52) U.S. Cl.
CPC .................................. *H03M 1/1014* (2013.01)
(58) Field of Classification Search
CPC ... H03M 1/1014; H03M 1/121; H03M 1/0836
USPC .......................................... 341/118, 120, 155
See application file for complete search history.

(56) References Cited

U.S. PATENT DOCUMENTS

| | | | |
|---|---|---|---|
| 3,604,954 A | 9/1971 | May et al. | |
| 7,250,885 B1 | 7/2007 | Nairn | |
| 8,307,248 B2 | 11/2012 | Johansson et al. | |
| 10,483,996 B1 | 11/2019 | Erdmann et al. | |
| 10,536,155 B1* | 1/2020 | Otte | G06F 11/0751 |
| 10,680,630 B1* | 6/2020 | David | H03M 1/0607 |
| 2022/0337260 A1* | 10/2022 | Shin | H04B 1/16 |

OTHER PUBLICATIONS

Chin-Yu Lin et al., "A 10b 2.6GS/s Time-Interleaved SAR ADC with Background Timing-Skew Calibration," ISSCC 2016, Session 27, Hybrid and Nyquist Data Converters, 27.7.

* cited by examiner

*Primary Examiner* — Peguy Jean Pierre
(74) *Attorney, Agent, or Firm* — Fish & Richardson P.C.

(57) ABSTRACT

An analog-to-digital conversion circuit includes analog-to-digital converters (ADCs) including a target analog-to-digital converter (ADC) providing second data samples, a first adjacent ADC providing first data samples, and a second adjacent ADC providing third data samples. The ADCs perform an analog-to-digital conversion using a time-interleaving approach in response to clock signals having different phases and including a reference clock signal. A timing calibration circuit includes a relative time skew generator generating a relative time skew and an absolute time skew generator generate an absolute time skew. A clock generator adjusts at least one phase of the clock signals based on the absolute time skew.

20 Claims, 13 Drawing Sheets

FIG. 10

| ADC | 1 | 2 | 3 | 4 |
|---|---|---|---|---|
| tskew | tskew1=0 | tskew2 | tskew3 | tskew4 |
| a | a1=0 | a2 | a3 | a4 |
| skew error | 0 | $\dfrac{tskew3}{2}$ | $\dfrac{tskew3}{4} + \dfrac{tskew4}{2}$ | $\dfrac{tskew3}{8} + \dfrac{tskew4}{4}$ |
| a-skew error | 0 | $a2 - \dfrac{tskew3}{2}$ | $a3 - \dfrac{tskew3}{4} - \dfrac{tskew4}{2}$ | $a4 - \dfrac{tskew3}{8} - \dfrac{tskew4}{4}$ |

ANALOG-TO-DIGITAL CONVERSION CIRCUIT AND RECEIVER INCLUDING SAME

CROSS-REFERENCE TO RELATED APPLICATION

This application claims priority under 35 U.S.C. § 119 to Korean Patent Application No. 10-2021-0070108 filed on May 31, 2021 in the Korean Intellectual Property Office, the subject matter of which is hereby incorporated by reference in its entirety.

BACKGROUND

Embodiments, of the inventive concept relate to an analog-to-digital conversion circuit capable of converting an analog signal into a corresponding digital signal using a time-interleaving approach. Embodiments of the inventive concept also relate to a receiver including the analog-to-digital conversion circuit.

An analog-to-digital conversion circuit may include a plurality of analog-to-digital converters. Fast, analog-to-digital conversion may be accomplished by control of the analog-to-digital converters using a time-interleaving approach. However, a time skew error between the respective clock signals associated with each of the analog-to-digital converters may cause data distortion which may lead to degradation in the overall performance of the analog-to-digital conversion circuit.

SUMMARY

Embodiments of the inventive concept provide analog-to-digital conversion circuits exhibiting improved analog-to-digital conversion performance by effectively calibrating a time skew otherwise generated during the analog-to-digital conversion process. Embodiments of the inventive concept also provide receivers including such analog-to-digital conversion circuits.

According to an aspect of the inventive concept, there is provided an analog-to-digital conversion circuit including; analog-to-digital converters (ADCs) including a target analog-to-digital converter (ADC) providing second data samples, a first adjacent ADC providing first data samples, and a second adjacent ADC providing third data samples, wherein the ADCs are configured to perform analog-to-digital conversion using a time-interleaving approach respectively in response to clock signals having different phases and including a reference clock signal, a timing calibration circuit including a relative time skew generator and an absolute time skew generator, wherein the relative time skew generator is configured to generate a relative time skew of the clock signals based on a comparison between a first correlation value and a second correlation value, the first correlation value being a difference between a first data sample and a second data sample, and the second correlation value being a differences between a second data sample and a third data sample, and the absolute time skew generator is configured to generate an absolute time skew of the clock signals, excluding the reference clock signal, based on the relative time skew, and a clock generator configured to adjust at least one phase of a clock signal among the clock signals based on the absolute time skew.

According to an aspect of the inventive concept, there is provided a method of operating an analog-to-digital conversion circuit including N analog-to-digital converters (ADCs). The ADCs include a target analog-to-digital converter (ADC) providing second data samples, a first adjacent ADC providing first data samples, and a second adjacent ADC providing third data samples, wherein 'N' is a positive integer greater than 1. The ADCs are configured to perform analog-to-digital conversion using a time-interleaving approach in response to clock signals having different phases. The method includes: setting a value K less than N, where K identifies the target ADC among the ADCs; (A) generating a relative time skew for the target ADC based on a first correlation value between respective first data samples and second data samples, and a second correlation value between respective second data samples and third data samples; (B) adjusting a $K^{th}$ clock applied to the target ADC based on the relative time skew; (C) determining whether K is equal to N; and if K is not equal to N, incrementing K and then sequentially repeating (A), (B) and (C), else if K is equal to N, generating absolute time skews of the clock signals based on relative time skews and an error calibration matrix, and adjusting phases of the clock signals based on the absolute time skews.

According to an aspect of the inventive concept, there is provided a method of operating an analog-to-digital conversion circuit including N analog-to-digital converters (ADCs). The ADCs include a target analog-to-digital converter (ADC) providing second data samples, a first adjacent ADC providing first data samples, and a second adjacent ADC providing third data samples, 'N' is a positive integer greater than 1. The ADCs are configured to perform analog-to-digital conversion using a time-interleaving approach in response to clock signals having different phases. The method includes: setting a value K less than N, where K identifies the target ADC among the ADCs; (A) generating a relative time skew for the target ADC; (B) adjusting a $K^{th}$ clock applied to the target ADC based on the relative time skew; (C) determining whether K is equal to N, and if K is not equal to N, incrementing K and then sequentially repeating (1), (2) and (3), else if K is equal to N, generating absolute time skews of the clock signals based on relative time skews and an error calibration matrix, and adjusting phases of the clock signals based on the absolute time skews, wherein the generating of the relative time skew for the target ADC comprises; performing first correlation operations between second data samples and first data samples to generate first operation values, performing second correlation operations between second data samples and third data samples to generate second operation values, performing subtraction operations between the first operation values and the second operation values to generate subtraction values, accumulating the subtraction values to generate an accumulation value, and averaging the accumulation value to generate an average value, wherein the relative time skew is determined in relation to the average value.

BRIEF DESCRIPTION OF THE DRAWINGS

Embodiments of the inventive concept, as well as the making and use of the inventive concept, may be more clearly understood upon consideration of the following detailed description taken in conjunction with the accompanying drawings in which:

FIG. 10 is a table illustrating an exemplary error calibration matrix according to an embodiment of the inventive concept;

DETAILED DESCRIPTION

Throughout the written description and drawings, like reference numbers and labels are used to denote like or similar elements, components and/or method steps.

Figure 1:
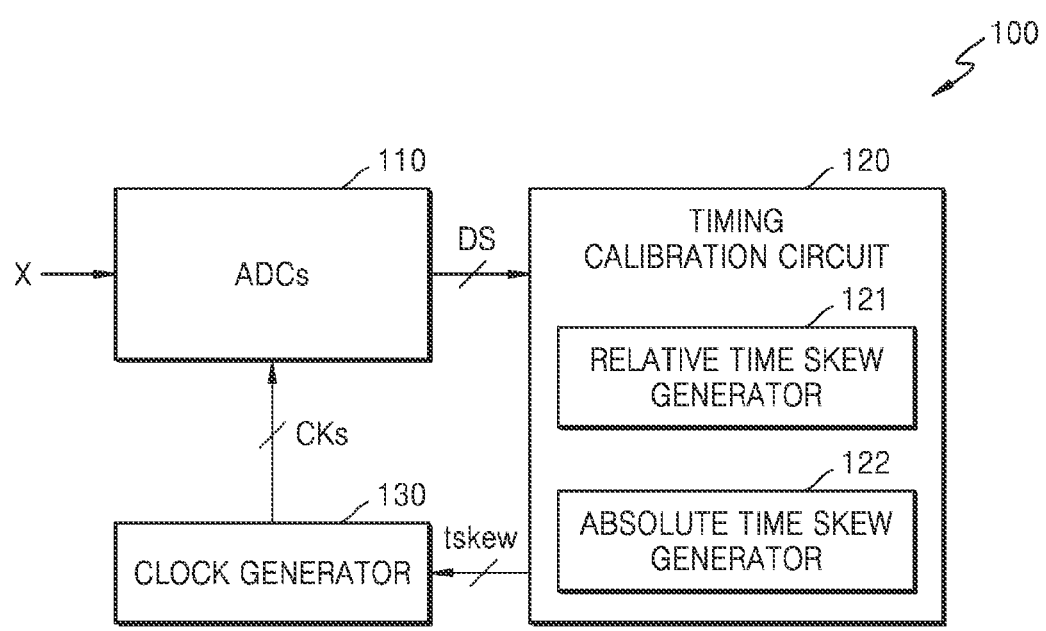
FIG. 1 is a block diagram illustrating an analog-to-digital conversion circuit according to an embodiment of the inventive concept.

Figure (FIG. 1 is a block diagram of an analog-to-digital conversion circuit 100 according to an embodiment of the inventive concept.

Referring to FIG. 1, the analog-to-digital conversion circuit 100 may include a plurality of analog-to-digital converters (hereafter, "ADCs") 110, a timing calibration circuit 120, and a clock generator 130.

Each of the ADCs 110 may be controlled using a time-interleaving (TI) approach. Thus, each of the ADCs 110 may be referred to as "TI ADC" or a "sub-ADC." Each of the ADCs 110 may output data samples DS derived by the sampling an externally-provided input signal X in response to one clock signal from among a plurality of clock signals (hereafter, "clock signals") CKs, wherein each one of the clock signals has a different phase. Thus, a first sub-ADC among the ADCs may output first data samples DS1 during a first sampling period in response to a first clock signal among the clock signals, and a second sub-ADC may output second data samples DS2 during a second sampling period (which may be the same as the first sampling period) in response to a second clock signal having a different phase than the first clock signal. Here, the input signal X may be an analog signal and each of the data samples DS may corresponds to a level (or magnitude) of the input signal X at a given time. Collectively, data samples constitute a digital signal corresponding to the input signal X.

The timing calibration circuit 120 may generate one or more time skew(s) (tskew) associated with the clock signals CKs using the data samples DS provided by the ADCs 110 over a defined sampling period. Hereinafter, the term "sampling period" denotes a period (or section) during which a preset number of data samples is output by selecting the ADCs 110 a number of times. In this regard, the timing calibration circuit 120 may generate a time skew for a target ADC from among the ADCs 110 using a correlation value between one set of data samples output by the target ADC and another set of data samples output by one or more adjacent ADC. Here, the term "adjacent ADC" denotes one or more ADC(s) that generates data samples temporally adjacent to the generation of data samples by the target ADC (e.g., an ADC that is temporally selected for sampling in relatively close proximate to the selection of the target ADC). In some embodiments, adjacent ADC(s) may be physically (or positionally) adjacent to the target ADC.

In some embodiments, the time skew provided by the timing calibration circuit 120 may include one or more absolute time skew(s). In this regard, the term "target ADC" denotes an ADC currently selected for time skew calibration from among the ADCs 110.

In the illustrated example of FIG. 1, the timing calibration circuit 120 includes a relative time skew generator 121 and an absolute time skew generator 122.

The relative time skew generator 121 may be used to generate a relative time skew for the ADCs 110. Here, the term "relative time skew" denotes to a time skew for a clock signal applied to the target ADC, as determined in relation to a time skew of a clock signal applied to the adjacent ADC.

In some embodiments, the relative time skew may be determined based on "target data samples" output by the target ADC and "adjacent data samples" output by the adjacent ADC. That is, the relative time skew generator 121 may generate the relative time skew based on a correlation value between the target data samples and the adjacent data samples. In this regard, the relative time skew generator 121 may generate the relative time skew, based on a comparison between a first correlation value (e.g., a multiplicative value on a target data sample and a first adjacent data sample) and a second correlation value (e.g., a multiplicative value on a target data sample and a second adjacent data sample). The first adjacent data sample refers to a data sample output by a first adjacent ADC adjacent to the target ADC, and the second adjacent data sample refers to a data sample output by a second adjacent ADC adjacent to the target ADC. Here, for example, the first adjacent ADC may receive a clock signal having a relatively faster phase than the clock signal applied to the target ADC, while the second adjacent ADC may receive a clock signal having a relatively slower phase than the clock signal applied to the target ADC.

Under conditions that the first correlation value is greater than the second correlation value, the phase of the clock signal applied to the target ADC may be understood as being closer to the phase of the clock signal applied to the second adjacent ADC, as compared with the phase of the clock signal applied to the first adjacent ADC. Accordingly, the relative time skew for the target ADC may have a positive (+) value. In some embodiments, the size of the relative time skew may be a preset (or predetermined) size. Alternately, the size of the relative time skew may be determined in proportion to a difference between the first correlation value and the second correlation value.

Under conditions that the second correlation value is greater than the first correlation value, the phase of the clock signal applied to the target ADC may be understood as being closer to the phase of the clock signal applied to the first adjacent ADC, as compared with the phase of the clock signal applied to the second adjacent ADC. Accordingly, the relative time skew for the target ADC may have a negative (−) value. In some embodiments, the size of the relative time skew may be a preset size. Alternately, the size of the relative time skew may be determined in proportion to the difference between the first correlation value and the second correlation value.

Of noted in regards to the foregoing, because the relative time skew is generated based on the data samples output according to clock signals—potentially having an existing time skew, the relative time skew may include (or incorporate) a corresponding skew error.

In this manner, the relative time skew generator 121 may generate a relative time skew for each of the ADCs 110, and may communicate the resulting relative time skews to the absolute time skew generator 122.

The absolute time skew generator 122 may generate absolute time skew(s) for the ADCs 110 based on the relative time skews. Accordingly, an absolute time skew denotes a time skew of the clock signal applied to the target ADC—which may be determined based on a time skew of a clock signal applied to a reference ADC. In this regard, the absolute time skew generator 122 may generate the absolute time skew based on the relative time skews previously determined by the relative time skew generator 121 and further based on an error calibration matrix for calibrating skew errors for the relative time skews. That is, the absolute time skew generator 122 may essentially remove skew errors from the relative time skews using the error calibration matrix.

Here, the "reference ADC" may be an ADC selected from among the ADCs 110 to determine time skews associated with the other (non-reference) ADCs. Accordingly, even when the target ADC varies, the reference ADC may remain constant. In some embodiments, the reference ADC may be a first ADC among the ADCs 110 and the target ADC may vary among a ADC and an N-th ADC, where 'N' is a natural number, among the ADCs.

In various embodiments of the inventive concept, the timing calibration circuit 120 may be implemented in software, hardware, and/or a combination of same (hereafter, singularly or in any reasonable combination, "hardware/software"). In FIG. 1, the relative time skew generator 121 and the absolute time skew generator 122 are shown as distinct components of the timing calibration circuit 120. However, those skilled in the art will appreciate that the relative time skew generator 121 and the absolute time skew generator 122 may be wholly or partially implemented using common hardware/software resources.

The clock generator 130 may generate the clock signals CKs used to respectively drive the ADCs 110. As noted above, the clock signals CKs may have respectively different phases. The clock generator 130 may generate a reference clock signal, and may generate the clock signals CKs having different phases by variously delaying the reference clock signal. As a result, the respective phases of the clock signals CKs may be separated by a pre-determined phase difference. For example, when the clock generator 130 generates first, second, third and fourth clock signals, CK1, CK2, CK3 and CK4, wherein the first clock signal CK1 has a phase of 0°, the second clock signal CK2 has a phase of 90°, the third clock signal CK3 has a phase of 180°, and the fourth clock signal CK4 has a phase of 270°.

Further, the clock generator 130 may serve to variously calibrate time skew errors associated with the clock signals CKs by selectively adjusting phases of one or more of the clock signals CKs in relation to the absolute time skew (tskew) received from the timing calibration circuit 120.

Accordingly, the analog-to-digital conversion circuit 100 of FIG. 1 may generate the absolute time skew by removing skew errors in the relative time skews, and may improve overall performance of the ADCs by adjusting the phases of the clock signals CKs based on the absolute time skew.

Figure 2:
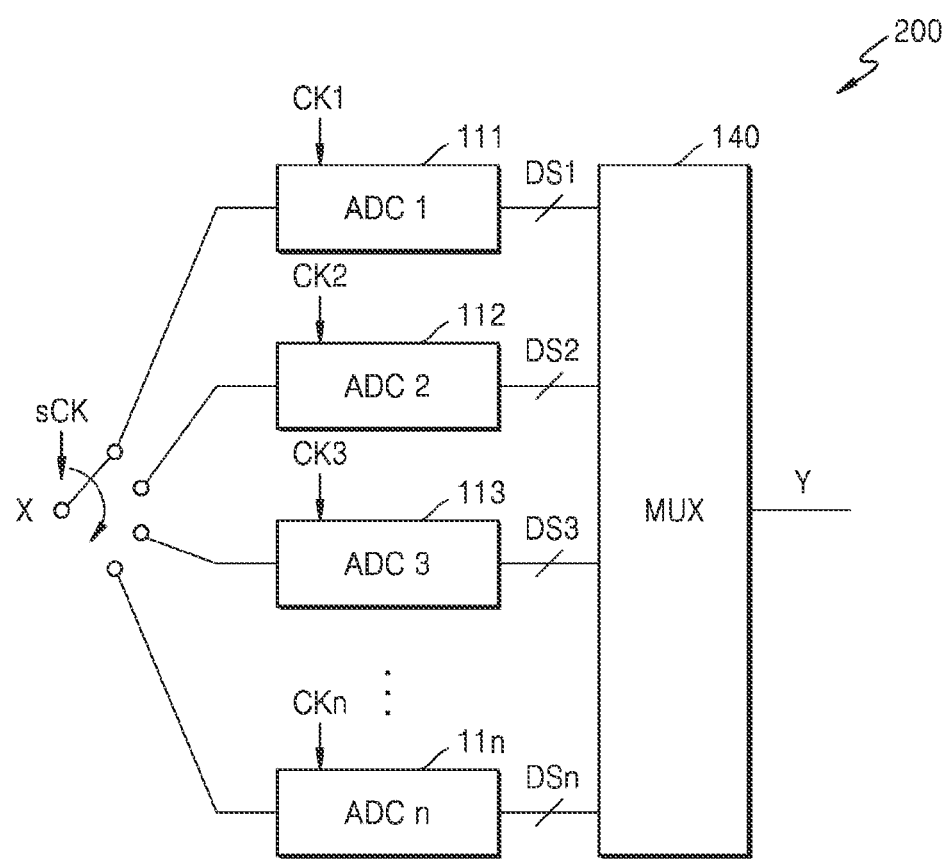
FIG. 2 is a block diagram illustrating an analog-to-digital conversion circuit controlled using a time-interleaving approach according to an embodiment of the inventive concept.

FIG. 2 is a block diagram of an analog-to-digital conversion circuit 200 operated in accordance with a time-interleaving approach according to an embodiment of the inventive concept.

Referring to FIG. 2, the analog-to-digital conversion circuit 200 may generate a digital signal 'Y' by alternately sampling the input signal 'X', based on clock signals CK1 through CKn having respectively different phases. (Here, 'n' is a natural number greater than 1). Further in this regard, the analog-to-digital conversion circuit 200 may include ADCs 111, 112, 113 . . . 11n (hereafter, "ADCs 111 through 11n"), as well as a selection circuit 140. Although not shown in FIG. 2, the analog-to-digital conversion circuit 200 may further include the analog-to-digital conversion circuit 100 of FIG. 1.

The ADCs 111 through 11n may be sequentially selected in response to a sample clock signal sCK, and may output first through n-th data samples DS1 through DSn by respectively sampling the input signal X in response to the clock signals CK1 through CKn. For example, the first ADC 111 may output a first data sample DS1 in response to a first clock signal CK1, the second ADC 112 may output a second data sample DS2 in response to a second clock signal CK2, etc. Here, the first data sample DS1 may include samples obtained at leading and/or lagging edge(s) of the first clock signal CK1, and the second data sample DS2 may include samples obtained at leading and/or lagging edges of the second clock signal CK2. In some embodiments, the clock signals CK1 through CKn may have the same frequency (e.g., a frequency equal to a sampling frequency fs divided by n).

In this manner, for example, the selection circuit 140 may output the digital signal Y by alternately selecting the first through n-th data samples DS1 through DSn.

Figure 3:
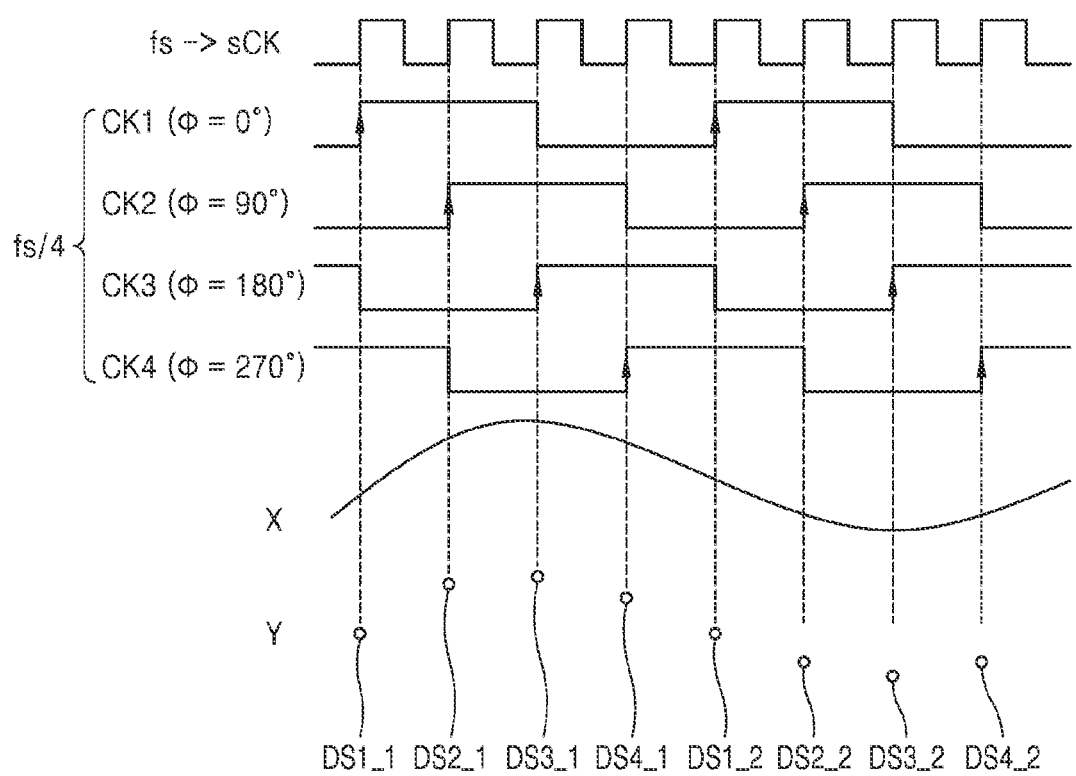
FIG. 3 is a waveform diagram further illustrating aspects of the time-interleaving approach according to an embodiment of the inventive concept.

FIG. 3 is a timing diagram further illustrating in one example a time-interleaving approach according to an embodiment of the inventive concept. Here, 'n' is assumed to be four (4) as a relatively simple example.

Referring to FIGS. 1, 2 and 3, the input signal X may be alternately sampled by first through fourth clock signals CK1 through CK4. The respective frequencies of the first through fourth clock signals CK1 through CK4 may be the same. However, assuming a sampling frequency of fs/4, and the phases of the first through fourth clock signals CK1 through CK4 may be 0°, 90°, 180°, and 270°, as described above. In response to these exemplary clock characteristics, edge timings for the first through fourth clock signals CK1 through CK4 may occur repeatedly and sequentially, such that first data samples DS1_1 and DS1_2 are obtained by the first clock signal CK1, second data samples DS2_1 and DS2_2 are obtained by the second clock signal CK2, third data samples DS3_1 and DS3_2 are obtained by the third clock signal CK3, and fourth data samples DS4_1 and DS4_2 are be obtained by the fourth clock signal CK4.

Because the respective frequencies of the first through fourth clock signals CK1 through CK4 correspond to the sample frequency fs/4—yet the first through fourth data samples DS1_1, DS1_2, DS2_1, DS2_2, DS3_1, DS3_2, DS4_1, and DS4_2 constitute the output signal Y, a frequency at which the input signal X is sampled may be understood as the sample frequency fs. The first through fourth data samples DS1_1, DS1_2, DS2_1, DS2_2, DS3_1, DS3_2, DS4_1, and DS4_2 may constitute the output signal Y by being sequentially output in an order consistent with their sampling.

Figure 4:
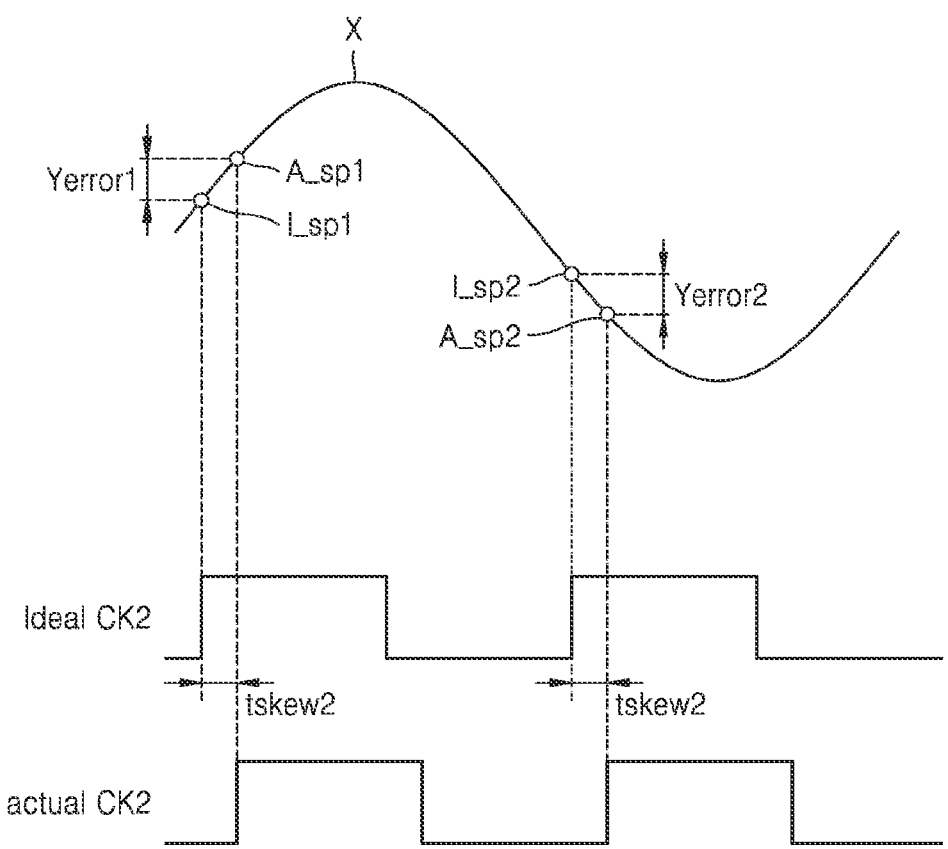
FIG. 4 is a waveform diagram illustrating a method of operating a clock generator that adjusts the phase of a clock signal based on an absolute time skew according to an embodiment of the inventive concept.

FIG. 4 is a waveform diagram illustrating aspects of a time-interleaving approach according to embodiments of the inventive concept adjusting the phase of a clock signal based on an absolute time skew. Here, FIG. 4 illustrates a portion of the time-interleaving approach related to the adjusting of the phase of the second clock signal CK2 based on a second time skew (tskew2). However, those skilled in the art will appreciate that this is merely a selected example applied to the phase of an arbitrary selected clock signal.

Referring to FIGS. 1, 2, and 4, an ideal second clock signal (Ideal CK2) may be generated by the clock generator 130. However, an actual second clock signal (Actual CK2) may be communicated to the second ADC 112 due to one or more factors, such as variable length of associated wiring delivering the clock signal, variations in operating temperature of the analog-to-digital conversion circuit 100, capacitive coupling and other communication related noise, etc.).

Accordingly, the actual second clock signal Actual CK2 may include the second time skew tskew2, as compared with the ideal second clock signal Ideal CK2. Thus, the phase of the actual second clock signal Actual CK2 varies from the phase of the ideal second clock signal Ideal CK2.

Further in this regard, when the input signal X is sampled according to edge timings of the ideal second clock signal Ideal CK2, first and second ideal samples I_sp1 and I_sp2 are obtained. However, when the input signal X is sampled according to edge timings of the actual second clock signal Actual CK2, first and second actual samples A_sp1 and A_sp2 are obtained. Thus, because the edge timings are different between the actual second clock signal Actual CK2 and the ideal second clock signal Ideal CK2, output errors Yerror1 and Yerror2 may be generated between the first and second ideal samples I_sp1 and I_sp2 and the first and second actual samples A_sp1 and A_sp2.

Accordingly within embodiments of the inventive concept, the clock generator 130 will adjust the phase of the ideal second clock signal Ideal CK2 so that sampling is performed at a desired edge timing, and the first and second ideal samples I_sp1 and I_sp2 are obtained based on the phase-adjusted ideal second clock signal Ideal CK2. That is, the clock generator 130 may adjust the phase of the ideal second clock signal Ideal CK2 so that the edge timings become as fast (or slow) as the second time skew tskew2, and the second ADC 112 may obtain the first and second ideal samples I_sp1 and I_sp2 by sampling the input signal X, based on the actual second clock signal actual CK2.

Figure 5:
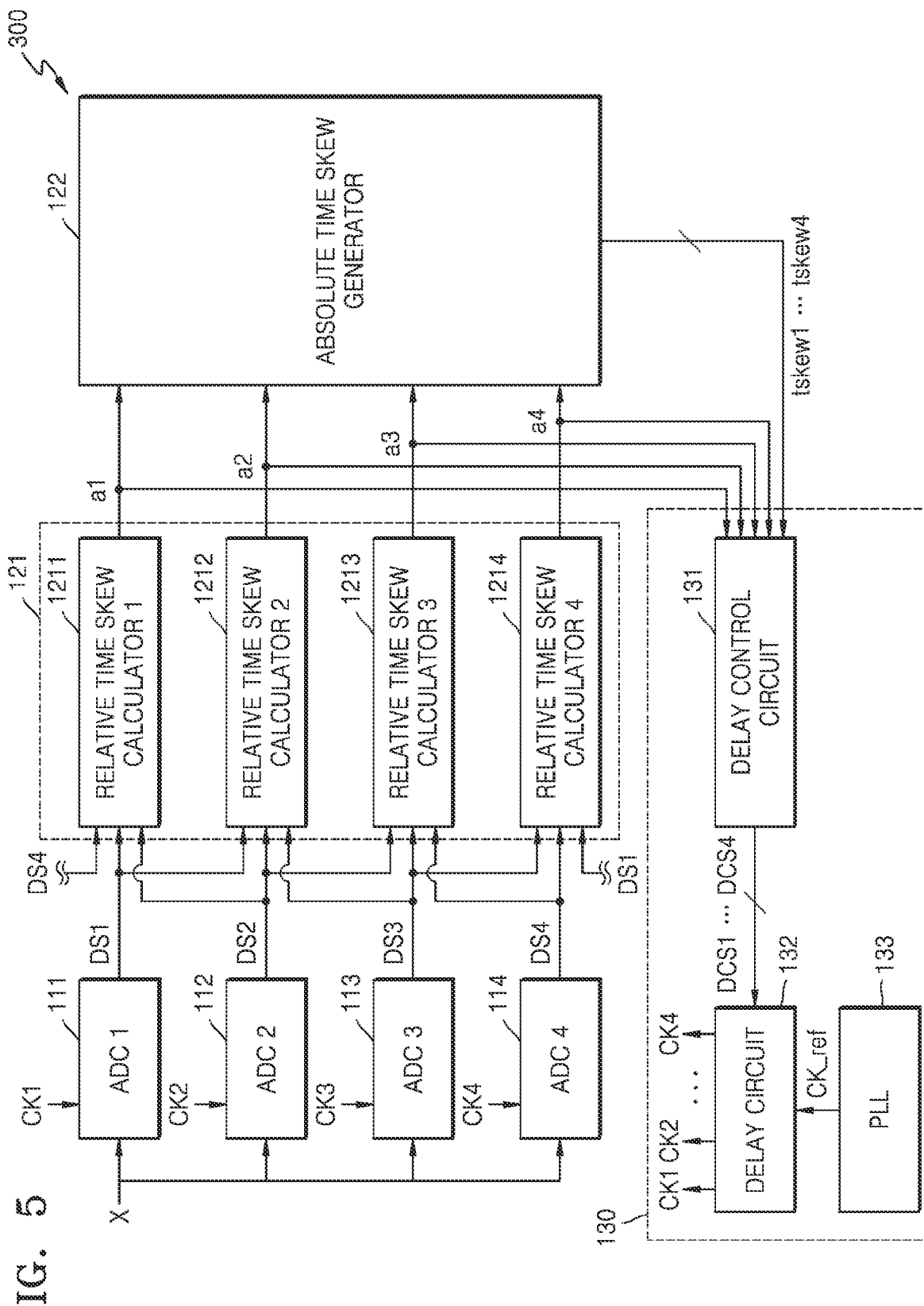
FIG. 5 is a block diagram illustrating an analog-to-digital conversion circuit according to an embodiment of the inventive concept.

FIG. 5 is a block diagram illustrating an analog-to-digital conversion circuit 300 according to an embodiment of the inventive concept.

Referring to FIG. 5, the analog-to-digital conversion circuit 300 may include the first through fourth ADCs 111 through 114, the relative time skew generator 121, the absolute time skew generator 122, and the clock generator 130. Here again, the number of ADCs described in relation to the analog-to-digital conversion circuit 300 is merely one example.

The relative time skew generator 121 may include first through fourth relative time skew calculators 1211 through 1214. The first through fourth relative time skew calculators 1211 through 1214 may correspond to the first through fourth ADCs 111 through 114, respectively. Each of the first through fourth relative time skew calculators 1211 through 1214 may receive data samples from a target ADC and adjacent ADCs and may calculate a relative time skew for the target ADC. The target ADC may correspond to each time skew generator. For example, the second relative time skew calculator 1212 may receive the first through third data samples DS1, DS2, and DS3 from the first through third ADCs 111, 112, and 113. The second relative time skew calculator 1212 may calculate a second relative time skew a2 for the second ADC 112, based on the first through third data samples DS1, DS2, and DS3. That is, the second relative time skew calculator 1212 may calculate a first correlation value between the first and second data samples DS1 and DS2 and a correlation value between the second and third data samples DS2 and DS3, and may calculate the second relative time skew a2 of the second ADC 112, based on a comparison result between the first correlation value and the second correlation value. As noted above, in some embodiments, the relative time skew a2 may be a preset value, or the second relative time skew a2 may be a value proportion to a difference between the first correlation value and the second correlation value. The first, third, and fourth relative time skew calculators 1211, 1213, and 1214 may operate the same as the second relative time skew calculator 1212 to thereby calculate first, third, and fourth relative time skews a1, a3, and a4 of the first, third, and fourth ADCs 111, 113, and 114. In some embodiments, the first relative time skew a1 may be considered to be 0. Accordingly, the first relative time skew calculator 1211 may be omitted.

The first through fourth time skew calculators 1211 through 1214 will be described in some additional detail with reference to FIG. 7.

In some embodiments, the first through fourth relative time skew calculators 1211 through 1214 may operate sequentially, and may sequentially output the first through fourth relative time skews a1 through a4. Every time when the first through fourth relative time skews a1 through a4 are output, the clock generator 130 may adjust the phase(s) of corresponding clock signal(s), based on the output first through fourth relative time skews a1 through a4.

When the phase of a clock signal is adjusted, a time skew is reduced, and thus a relative time skew output in next order may be increasingly similar to an absolute time skew. However, because at least one of a target ADC and first and second adjacent ADCs that determine the relative time skew output in next order operates based on clock signals having time skews, a skew error may be included in the relative time skew.

Accordingly, the absolute time skew generator 122 may receive the first through fourth relative time skews a1 through a4 and may output first through fourth absolute time skews (hereafter, "tskew1 through tskew4"). The absolute time skew generator 122 may generate the first through fourth absolute time skews tskew1 through tskew4 by removing the skew errors included in the first through fourth relative time skews a1 through a4 using an error calibration matrix. In some embodiments, the first absolute time skew tskew1 may be considered to be 0. Accordingly, the absolute time skew generator 122 may receive the second through fourth relative time skews a2 through a4 and may output the second through fourth relative time skews a2 through a4.

Exemplary method(s) of operation for the absolute time skew generator 122 will be described in some additional detail with reference to FIGS. 6, 9, and 10.

The clock generator 130 may receive the first through fourth absolute time skews tskew1 through tskew4, and may adjust the phases of the first through fourth clock signals CK1 through CK4.

As illustrated in FIG. 5, the clock generator 130 may include a delay control circuit 131, a delay circuit 132, and a phase locked loop (PLL) 133.

The delay control circuit 131 may generate first through fourth delay control signals DSC1 through DSC4, based on the first through fourth absolute time skews tskew1 through tskew4. In some embodiments, the first absolute time skew tskew1 may be considered to be 0, and the delay control circuit 131 may generate only the second through fourth delay control signals DSC2 through DSC4.

The delay circuit 132 may receive a reference clock signal CK_ref from the PLL 133, and may generate the first through fourth clock signals CK1 through CK4 by adjusting the phase of the reference clock signal CK_ref according to the first through fourth delay control signals DSC1 through DSC4. The delay circuit 132 is described in detail below with reference to FIG. 11.

The analog-to-digital conversion circuit 300 may calculate a correlation value, based on the first through fourth data samples DS1 through DS4 output by the first through fourth ADCs 111 through 114, and may generate the first through fourth relative time skews a1 through a4, based on the correlation value. Furthermore, because the analog-to-digital conversion circuit 300 may generate the first through fourth absolute time skews tskew1 through tskew4 including minimized skew errors using the error calibration matrix, the analog-to-digital conversion circuit 300 may provide improved time skew calibration performance for the first through fourth clock signals CK1 through CK4.

Figure 6:
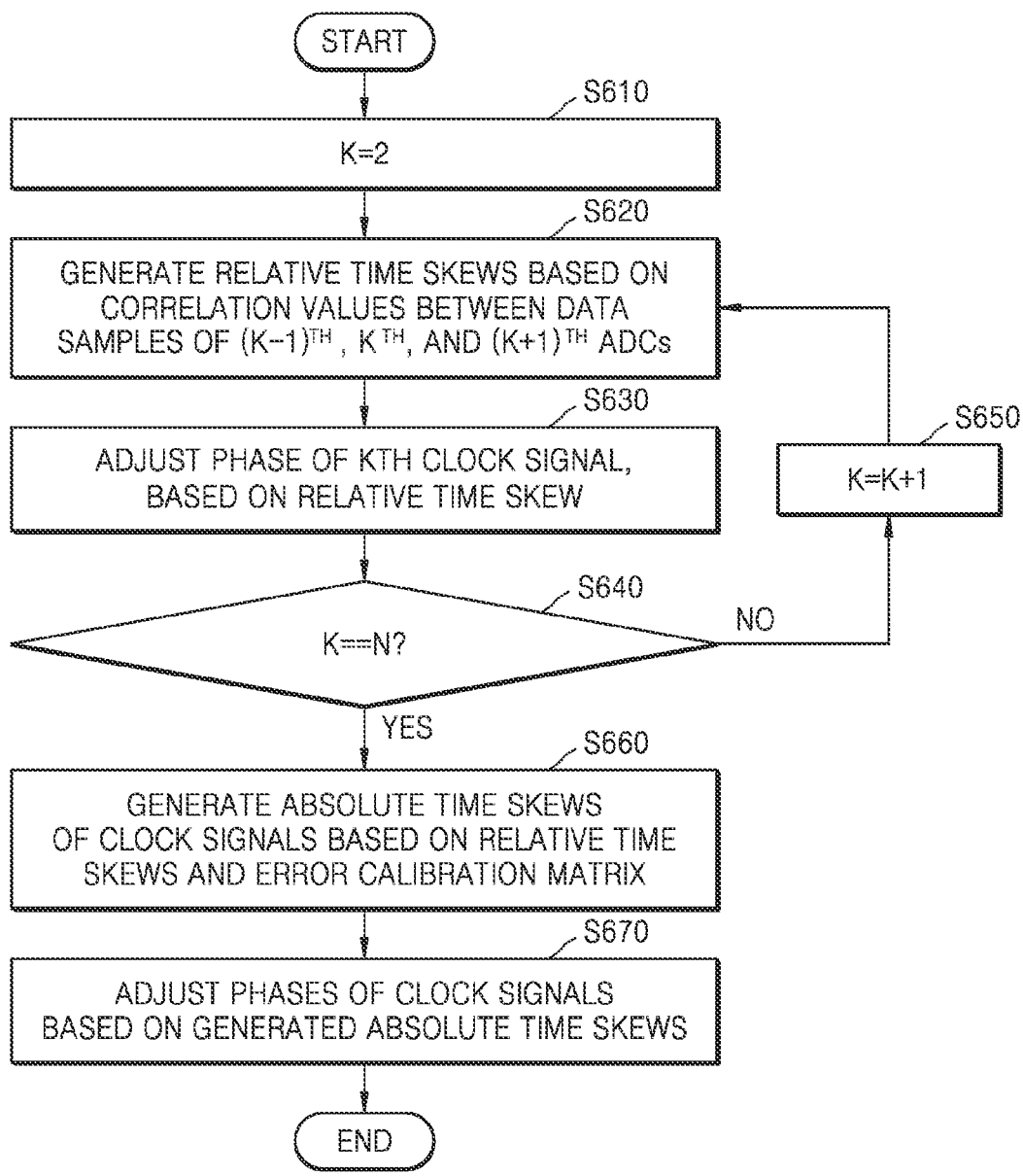
FIG. 6 is a flowchart illustrating a method of operating an analog-to-digital conversion circuit according to an embodiment of the inventive concept.

FIG. 6 is a flowchart illustrating method of operating analog-to-digital conversion circuit according to an embodiment of the inventive concept. Within the method of FIG. 6, method steps S610, S620, S630, S640 and S650 may be generally understood as adjusting the phase of a clock signal according to a relative time skew, and method steps S660 and S670 may be understood as calibrating the phase of the clock signal according to an absolute time skew.

Referring to FIG. 6 in the context of the FIGS. 1, 2, 3, 4 and 5, a value 'K' may be set to an arbitrary number (e.g., 2), thereby designating a target ADC among N ADCs 110, where 'N' is a positive integer greater than 1 (S610). Thus, assuming K=2, the target ADC may be set as a second ADC, and the first ADC may, therefore, be assumed to be a reference ADC. Accordingly, the time skew of a first clock signal applied to the first ADC may be considered to be 0.

The relative time skew generator 121 may obtain data samples from the first ADC $(K-1)^{th}$, the second ADC $(K^{th})$, and the third ADC $(K+1)^{th}$ and may generate relative time skews based on correlation values between the data samples (S620). That is, the relative time skew generator 121 may calculate a first correlation value between the data samples of the first ADC and the data samples of the second ADC and a second correlation value between the data samples of the second ADC and the data samples of the third ADC, and may calculate a relative time skew corresponding to the second ADC based on a comparison result between the first correlation value and the second correlation value. Because the relative time skew is calculated using the data samples sampled according to a clock signal having a time skew, the relative time skew may include a skew error.

The clock generator 130 may then adjust the phase of the second clock signal CLK2 applied to the second ADC based on the calculated relative time skew (S630). That is, the clock generator 130 may adjust the phase of the second clock signal CLK2 so that the relative time skew is removed.

When it is determined that K (the current value) is not equal to N (the number of ADCs) (S640=NO), the value of 'K' may be incremented so as to designate a next ADC among the ADCs 110 as the target ADC (e.g., the third ADC) (S650), then method steps S620 through S650 may be repeated until K equals N.

However, once is determined that K is equal to N (S640=YES), the absolute time skew generator 122 may generate absolute time skews for the clock signals based on the relative time skews and the error calibration matrix (S660). That is, the absolute time skew generator 122 may obtain relative time skews of the first through N-th ADCs by the iterative execution of method steps S610 through S650, and may perform a multiplication operation with respect to the relative time skews and the error calibration matrix. The absolute time skew generator 122 may obtain the absolute time skews of the first through N-th ADCs via the multiplication operation.

One example of an error calibration matrix in this regard will be described in some additional detail with reference to FIG. 10.

Once the absolute time skew generator 122 has generated absolute time skews for the clock signals based on the relative time skews and the error calibration matrix, the clock generator 130 may adjust the phases of the clock signals based on the generated absolute time skews (S670).

From the foregoing, those skilled in the art will appreciate that methods of operating an analog-to-digital conversion circuit according to embodiments of the inventive concept allow a skew error included in a relative time skew to be removed using the error calibration matrix, thereby improved ADC performance.

Figure 7:
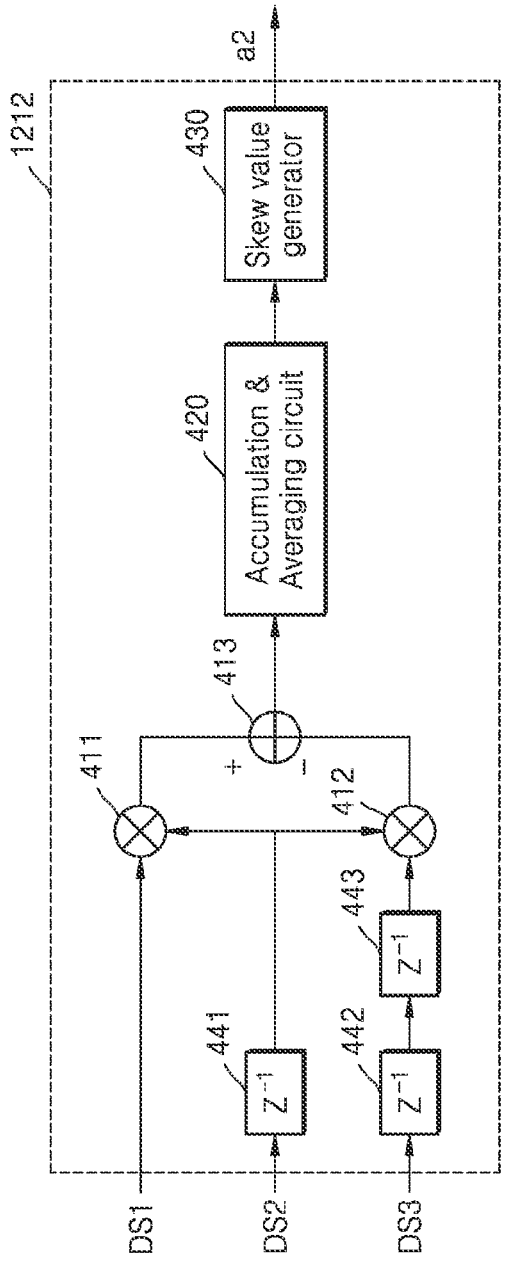
FIG. 7 is a block diagram further illustrating in one example the second relative time skew calculator 1212 of FIG. 5.

FIG. 7 is a block diagram further illustrating in one example the second relative time skew calculator 1212 of FIG. 5. However, the following description may be equally applied to the first, third, and fourth relative time skew calculators 1211, 1213, and 1214 of FIG. 5.

In FIG. 7, the second relative time skew calculator 1212 may receive the first through third data samples DS1 through DS3 and may output the second relative time skew a2.

The second relative time skew calculator 1212 may include first and second correlation operation circuits 411 and 412, a subtraction circuit 413, an accumulation & averaging circuit 420, a skew value generator 430, and first through third registers 441 through 443.

The first correlation operation circuit 411 may perform a sequence of first correlation operations by multiplying first data samples DS1 by second data samples DS2, respectively. The first data samples DS1 and the second data samples DS2 may be sequentially input to the first correlation operation circuit 411. The first data sample DS1 used in each of the first correlation operations may be a sample that has been sampled at a later time than the sampling of the second data sample DS2.

The second correlation operation circuit 412 may perform a sequence of second correlation operations by multiplying the second data samples DS2 by third data samples DS3, respectively. The second data samples DS2 and the third data samples DS3 may be sequentially input to the second correlation operation circuit 412. The second data sample DS2 used in each of the second correlation operations may be a sample that has been sampled at a later time than the sampling of the third data sample DS3.

The subtraction circuit 413 may perform a sequence of subtraction operations between first operation values of the first correlation operations (i.e., the first correlation values) and second operation values of the second correlation operations (i.e., the second correlation values), respectively. The subtraction circuit 413 may provide subtraction results for the sequence of subtraction operations to the accumulation & averaging circuit 420.

The accumulation & averaging circuit 420 may accumulate the subtraction results for the sequence of subtraction operations to generate an accumulation result, and divide the accumulation result by a number of subtraction operations to calculate an average value. When the average value is positive (+), the sampling timing of the second data sample DS2 is closer to a sampling timing of the third data sample DS3 than to a sampling timing of the first data sample DS1, and thus, the second relative time skew a2 may be understood as a positive value. Otherwise, when the average value is negative (−), the sampling timing of the second data sample DS2 is closer to the sampling timing of the first data sample DS1 than to the sampling timing of the third data sample DS3, and thus, the second relative time skew a2 may be understood as a negative value. The accumulation & averaging circuit 420 may provide the average value to the skew value generator 430.

The skew value generator 430 may determine the value of the second relative time skew a2 based on the average value. In some embodiments, when the average value is positive, the skew value generator 430 may determine a preset positive value as the value of the second relative time skew a2. Alternately, when the average value is negative, the skew value generator 430 may determine a preset negative value as the value of the second relative time skew a2. In some embodiments, the skew value generator 430 may determine a size of the second relative time skew a2 to be proportional to an absolute size of the average value. For example, when the average value is positive and is relatively large, the sampling timing of the second data sample DS2 is closer to the sampling timing of the third data sample DS3 than to the sampling timing of the first data sample DS1, and thus, the value of the second relative time skew a2 may be understood as a large value.

The first, second, and third registers 441, 442, and 443 may delay time points when the second and third data samples DS2 and DS3 are communicated to the first and second correlation operation circuits 411 and 412. For example, as the first register 441 delays the time point when the second data sample DS2 is communicated to the first correlation operation circuit 411, a first correlation operation may be performed on the second data sample DS2 and the first data sample DS1 sampled at a later time than the second data sample DS2. As the second and third registers 442 and 443 delay the time point when the third data sample DS3 is communicated to the second correlation operation circuit 412, a second correlation operation may be performed on the third data sample DS3 and the second data sample DS2 sampled at a later time than the third data sample DS3.

Figure 8:
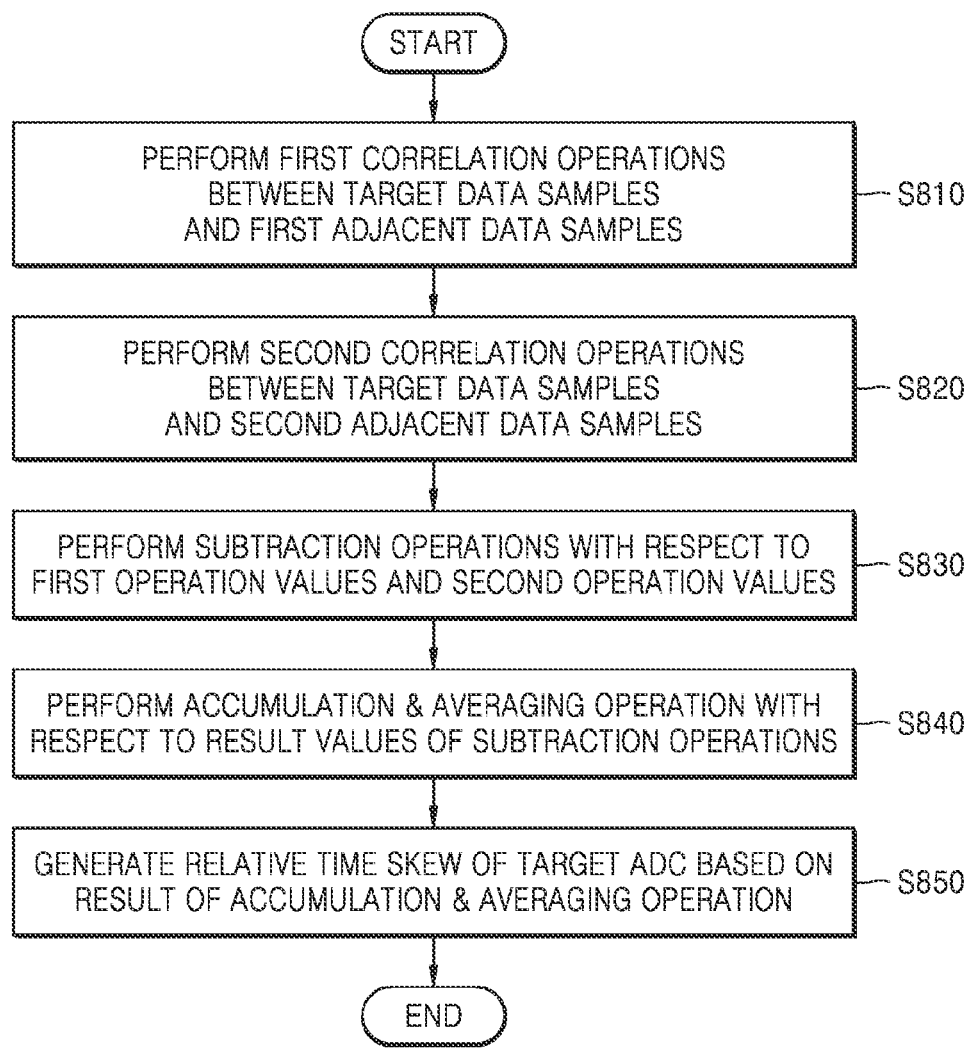
FIGS. 8 and 9 are respective flowcharts illustrating methods of operating an analog-to-digital conversion circuit according to embodiments of the inventive concept.

FIG. 8 is a flowchart illustrating a method of operating an analog-to-digital conversion circuit according to embodiments of the inventive concept.

Referring to FIGS. 1, 5, and 7, the first correlation operation circuit 411 may perform first correlation operations between target data samples and first adjacent data samples (S810). The target data samples may be data samples output by a target ADC related to a relative time skew that is to be generated. The first adjacent data samples may be data samples output by a first ADC adjacent to the target ADC. In some embodiments, the first correlation operations may be multiplications between the target data samples and the first adjacent data samples.

The second correlation operation circuit 412 may perform second correlation operations between target data samples and second adjacent data samples (S820). The second adjacent data samples may be data samples output by a second ADC adjacent to the target ADC. In some embodiments, the second correlation operations may be multiplications between the target data samples and the second adjacent data samples.

The subtraction circuit 413 may perform subtraction operations with respect to first operation values corresponding to results of the first correlation operations and second operation values corresponding to results of the second correlation operations (S830).

The accumulation & averaging circuit 420 may perform an accumulation & averaging operation with respect to result values of the subtraction operations (S840). That is, the accumulation & averaging circuit 420 may perform addition on the result values of the subtraction operations and divide a result of the addition by the number of subtraction operations to thereby obtain an average value.

The skew value generator 430 may generate a relative time skew of the target ADC based on the average value (S850). In some embodiments, when the average value is positive, the skew value generator 430 may determine a preset positive value as the value of the second relative time skew a2. Alternately, when the average value is negative, the skew value generator 430 may determine a preset negative value as the value of the second relative time skew a2. According to embodiments, the skew value generator 430 may determine the size of the second relative time skew a2 to be proportional to the absolute size of the average value.

Figure 9:
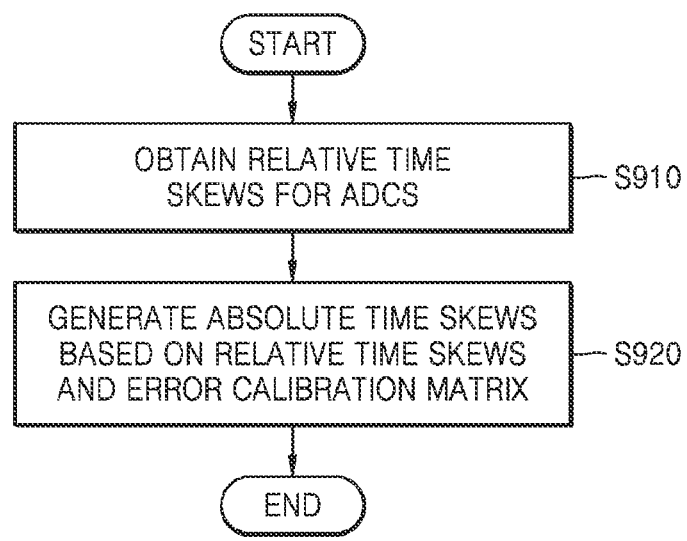

FIG. 9 is a flowchart illustrating a method of operating an analog-to-digital conversion circuit according to an embodiment of the inventive concept.

Referring to FIGS. 1, 5, 7, and 8, the absolute time skew generator 122 may obtain first through a-th relative time skews a1 through and for the ADCs 111 through 11n (S910). In some embodiments, the first relative time skew a1 may be considered to be 0. Accordingly, the absolute time skew generator 122 may obtain the second through n-th relative time skews a2 through an.

The absolute time skew generator 122 may generate first through n-th absolute time skews tskew1 through tskewn based on the first through a-th relative time skews a1 through an and the error calibration matrix (S920). The error calibration matrix may be a matrix multiplied by an n by 1 matrix using the first through a-th relative time skews a1 through an as an element in order to calibrate errors in the first through a-th relative time skews a1 through an. In some embodiments, because the first relative time skew a1 may be considered to be 0, the error calibration matrix may be a matrix multiplied by an n−1 by 1 matrix using the second through n-th relative time skews a2 through an as an element in order to calibrate errors in the second through n-th relative time skews a2 through an. In some embodiments, the first absolute time skew tskew1 may also be considered to be 0.

FIG. 10 is a table illustrating in one example an error calibration matrix according to an embodiment of the inventive concept. Here, FIG. 10 assumes a method of calculating the error calibration matrix when an analog-to-digital conversion circuit includes first through fourth ADCs.

Thus, referring to the table of FIG. 10 in the context of the embodiments previously described in relation to FIGS. 1, 2, 3, 4, 5, 6, 7 and 8, the first absolute time skew tskew1 and the first relative time skew a1 may be considered to be 0. The second through fourth absolute time skews tskew2 through tskew4 may be time skews that the second through fourth clock signals CK2 through CK4 have, compared with the first clock signal CK1 applied to the first ADC.

The second through fourth relative time skews a2 through a4 may be generated by the relative time skew generator 121. A relative time skew may be generated based on data samples output by the target ADC and the first and second adjacent ADCs, and the data samples may be sampled according to clock signals having time skews. Accordingly, the relative time skew may include a skew error. That is, even when the phase of a clock signal is adjusted based on the relative time skew, the clock signals may still have time skews.

In some embodiments, the first through fourth relative time skews a1 through a4 may be sequentially generated. Every time when the first through fourth relative time skews a1 through a4 are generated, the clock generator 130 may adjust the phases of corresponding clock signals, based on the generated first through fourth relative time skews a1 through a4. When the phase of a clock signal is adjusted, a time skew is reduced, and thus, a relative time skew generated in a later order may include a smaller skew error.

A skew error corresponding to a relative time skew may be calculated based on an absolute time skew.

For example, a skew error corresponding to the relative time skew a2 of the second ADC may be calculated as $$\frac{tskew2}{2}$$

as an average value between the first absolute time skew tskew1 and the third absolute time skew tskew3. A skew error in the relative time skew a3 of the third ADC may be calculated as $$\frac{tskew3}{4} + \frac{tskew4}{2}$$

as an average value between the skew error corresponding to the relative time skew a2 of the second ADC and the fourth absolute time skew tskew4. A skew error in the relative time skew a4 of the fourth ADC may be calculated as $$\frac{tskew3}{8} + \frac{tskew4}{4}$$

as an average value between the skew error corresponding to the relative time skew a3 of the third ADC and the first absolute time skew tskew1.

Accordingly, a value obtained by removing a skew error from a relative time skew a may be estimated as an absolute time skew tskew. For example, the second absolute time skew tskew2 may be estimated as $$a2 - \frac{tskew3}{2},$$

the third absolute time skew tskew3 may be estimated as $$a3 - \frac{tskew3}{4} - \frac{tskew4}{2},$$

and the fourth absolute time skew tskew4 may be estimated as $$a4 - \frac{tskew3}{8} - \frac{tskew4}{4}.$$

Accordingly, a relationship between the second through fourth absolute time skews tskew2 through tskew4 and the second through fourth relative time skews tskew2 through tskew4 may be expressed as in [Equation 1].

$$\begin{pmatrix} tskew2 \\ tskew3 \\ tskew4 \end{pmatrix} = \begin{pmatrix} 1 & \frac{1}{2} & 0 \\ 0 & \frac{5}{4} & \frac{1}{2} \\ 0 & \frac{1}{8} & \frac{5}{4} \end{pmatrix}^{-1} \begin{pmatrix} a2 \\ a3 \\ a4 \end{pmatrix}, \quad \text{[Equation 1]}$$

wherein a matrix multiplied by a matrix of the second through fourth relative time skews a2 through a4 may be referred to as an error calibration matrix.

That is, the absolute time skew generator 122 may generate the second through fourth time skews tskew2 through tskew4 by multiplying the received second through fourth relative time skews a2 through a4 by the error calibration matrix. The error calibration matrix may be pre-stored in the absolute time skew generator 122.

Figure 11:
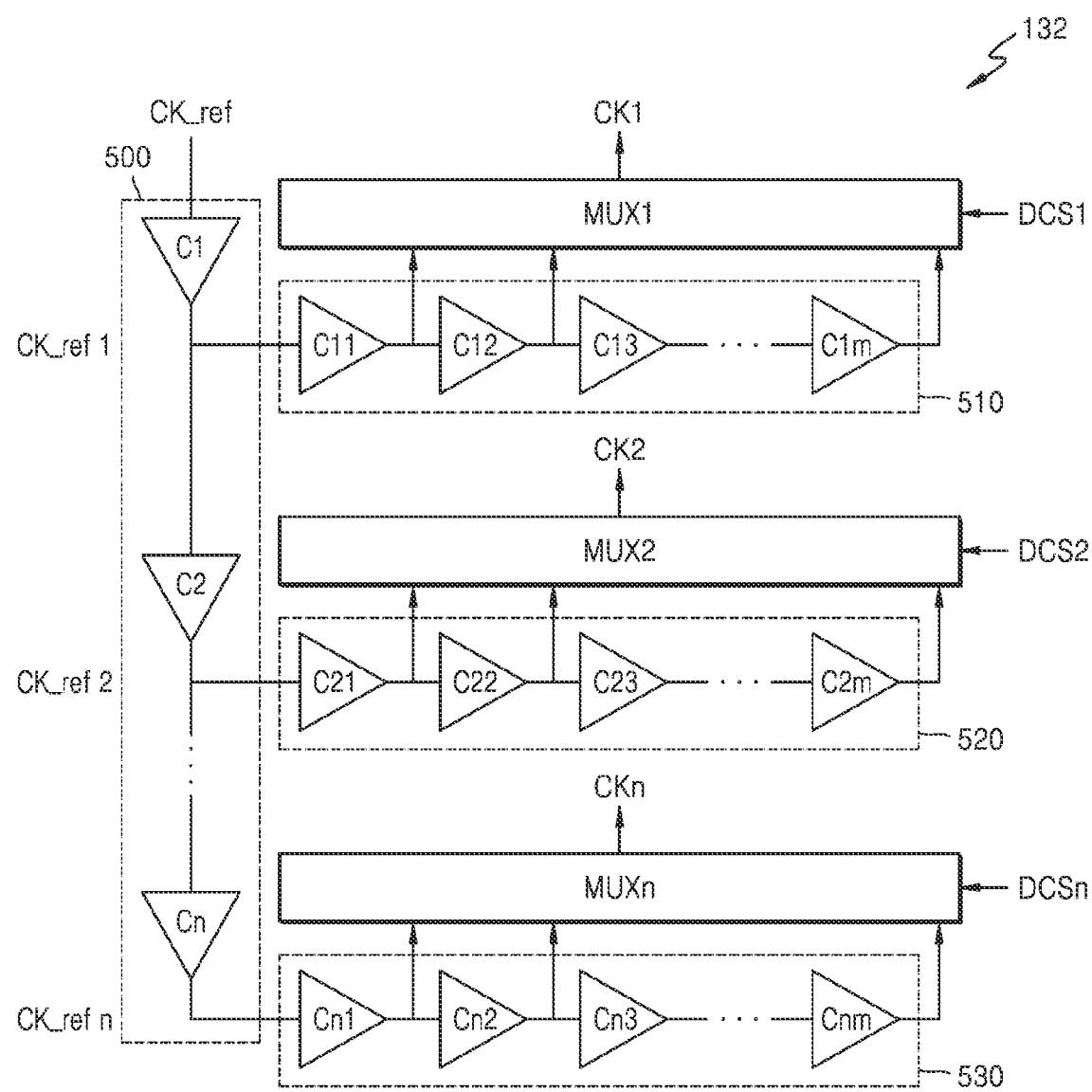
FIG. 11 is a block diagram further illustrating in one example the delay circuit 132 of FIG. 5.

FIG. 11 is a block diagram illustrating in one example the delay circuit 132 of FIG. 5 according to an embodiment of the inventive concept.

Referring to FIG. 11, the delay circuit 132 may receive the reference clock signal CK_ref and may generate the first through n-th clock signals CK1 through CKn according to the first through n-th delay control signals DSC1 through DSCn.

The delay circuit 132 may include a reference clock buffer circuit 500, first through n-th clock buffer circuits 510 through 530, and first through n-th selection circuits MUX1 through MUXn.

The reference clock buffer circuit 500 may include buffers C1 through Cn. The buffers C1 through Cn may generate first through n-th reference clock signals CK_ref1 through CK_refn by delaying the reference clock signal CK_ref by different degrees.

The first through n-th clock buffer circuits 510 through 530 may receive the first through n-th reference clock signals CK_ref1 through CK_refn, respectively, and may delay the first through n-th reference clock signals CK_ref1 through CK_refn by different degrees, respectively. For example, the first clock buffer circuit 510 may include buffers C11 through C1m. The buffers C11 through C1m may delay the first reference clock signal CK_ref1 by different degrees.

The first through n-th selection circuits MUX1 through MUXn may select one from clock signals output by the first through n-th clock buffer circuits 510 through 530, based on the first through n-th delay control signals DCS1 through DCSn. For example, the first selection circuit MUX1 may select one from clock signals having various phases, which are output by the first clock buffer circuit 510, based on the first delay control signal DCS1, and may output the selected clock signal to the outside.

Figure 12:
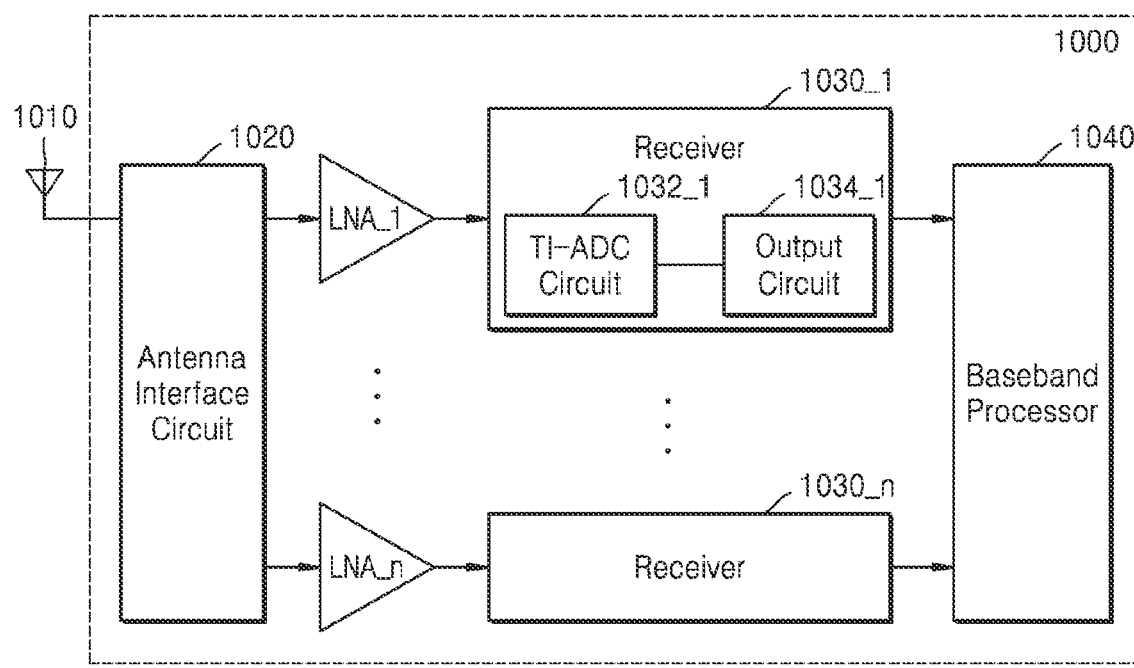
FIG. 12 is a block diagram illustrating a wireless communication device according to an embodiment of the inventive concept.

FIG. 12 is a block diagram of a wireless communication device 1000 according to an embodiment of the inventive concept.

Referring to FIG. 12, the wireless communication device 1000 may include an antenna 1010, an antenna interface circuit 1020, low noise amplifiers (LNAs) LNA_1 through LNA_n, receivers 1030_1 through 1030_n, and a baseband processor 1040.

The antenna interface circuit 1020 may route an analog signal received through the antenna 1010 to one of the receivers 1030_1 through 1030_n. The antenna interface circuit 1020 may include switches, a duplexer, a filter circuit, and an input matching circuit, for example.

The LNAs LNA_1 through LNA_n may perform low frequency amplification on the received analog signal and output a result of the low frequency amplification to the receivers 1030_1 through 1030_n connected to the LNAs LNA_1 through LNA_n, respectively.

The baseband processor 1040 may perform a processing operation including demodulation and the like, with respect to digital signals communicated by the receivers 1030_1 through 1030_n.

In some embodiments, the first receiver 1030_1 may include an analog-to-digital conversion circuit 1032_1 to which embodiments of the inventive concept are applied, and an output circuit 1034_1. The analog-to-digital conversion circuit 1032_1 may convert the analog signal received from the first LNA LNA_1 into a digital signal, and may perform time skew calibration consistent with the inventive concept during the conversion. Because a time skew error has already been corrected during analog-to-digital conversion via time skew calibration as a background operation, the analog-to-digital conversion circuit 1032_1 may rapidly provide a quality-improved digital signal to the baseband processor 1040. According to some embodiments, the first receiver 1030_1 may be implemented to further include the first LNA LNA_1.

According to an embodiment, the output circuit 1034_1 may perform a quality improvement operation on the digital signal output by the analog-to-digital conversion circuit 1032_1. For example, the output circuit 1034_1 may equalize the digital signal, based on at least one of continuous time linear equalization (CTLE), decision feedback equalization (DFE), and Feed-Forward equalization (FFE).

The above-described structure of the first receiver 1030_1 is equally applicable to the other receivers 1030_2 through 1030_n.

Figure 13:
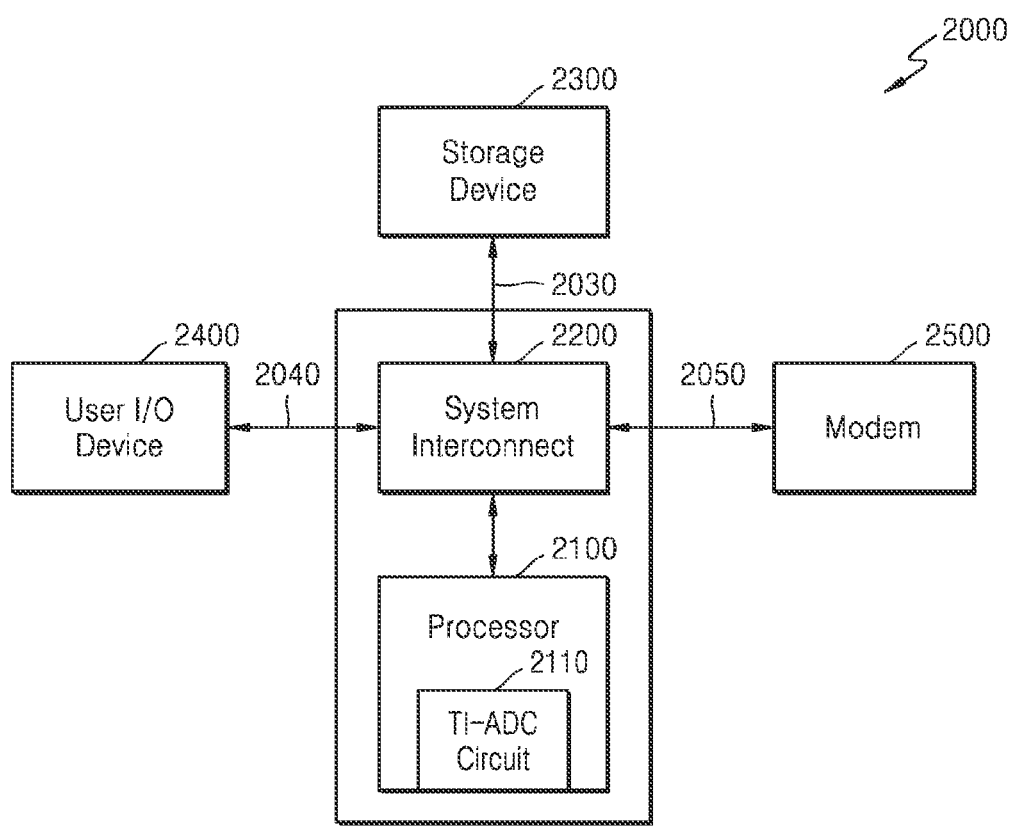
FIG. 13 is a block diagram illustrating a computing system according to an embodiment of the inventive concept.

FIG. 13 is a block diagram of a computing system 2000 according to an embodiment of the inventive concept.

Referring to FIG. 13, the computing system 2000 may include a processor 2100, a system interconnect 2200, a storage device 2300, a user input/output (I/O) device 2400, and a modem 2500. According to some embodiments, the processor 2100, the system interconnect 2200, the storage device 2300, the user I/O device 2400, and the modem 2500 may be mounted on one substrate (not shown). The storage device 2300, the user I/O device 2400, and the modem 2500 may be connected to the system interconnect 2200 via channels 2030, 2040, and 2050, respectively. The channels 2030, 2040, and 2050 may be based on one of various standards such as Peripheral Component Interconnect express (PCIe), Nonvolatile Memory express (NVMe), Advanced eXtensible Interface (AXI), and ARM Microcontroller Bus Architecture (AMBA).

The storage device 2300 may function as a memory of the computing system 2000. The storage device 2300 may store an original data of user data, application and an operating system (OS) executed by the processor 2100. The storage device 2300 may include a hard disk drive (HDD), a solid state drive (SSD), an optical disk drive (ODD), etc.

The user I/O device 2400 may be configured to exchange information with a user. The user I/O device 2400 may include a user input device for receiving information from the user, such as a keyboard, a mouse, a touch panel, an operation sensor, and a microphone. The user I/O device 2400 may include a user output device for providing information to the user, such as a display device, a speaker, a beam projector, and a printer.

The modem 2500 may be configured to exchange data with an external device in a wired or wireless manner. According to an embodiment, the modem 2500 may be integrated with the processor 2100.

The processor 2100 may control the computing system 2000 and may include a central processor or application processor for performing various operations. The processor 2100 may include an analog-to-digital conversion circuit 2110 to which embodiments of the inventive concept have been applied. The analog-to-digital conversion circuit 2110 may convert an analog signal received from the storage device 2300, the user I/O device 2400, and the modem 2500 via the system interconnect 2200 into a digital signal, and may perform time skew calibration to which the technical spirit of the inventive concept has been applied, during the conversion. Because a time skew error has already been corrected during analog-to-digital conversion via time skew calibration as a background operation, the analog-to-digital conversion circuit 2110 may rapidly provide a quality-improved digital signal to the processor 2100. According to some embodiments, the analog-to-digital conversion circuit 2110 may be implemented to be included in the system interconnect 2200.

While the inventive concept has been particularly shown and described with reference to embodiments thereof, it will be understood that various changes in form and details may be made therein without departing from the spirit and scope of the following claims.

What is claimed is:

1. An analog-to-digital conversion circuit comprising:
analog-to-digital converters (ADCs) including a target analog-to-digital converter (ADC) providing second data samples, a first adjacent ADC providing first data samples, and a second adjacent ADC providing third data samples, wherein the ADCs are configured to perform analog-to-digital conversion using a time-interleaving approach respectively in response to clock signals having different phases and including a reference clock signal;
a timing calibration circuit including a relative time skew generator and an absolute time skew generator, wherein the relative time skew generator is configured to generate a relative time skew of the clock signals based on a comparison between a first correlation value and a second correlation value, the first correlation value being a multiplicative value on a first data sample and a second data sample, and the second correlation value being a multiplicative value on a second data sample and a third data sample, and the absolute time skew generator is configured to generate an absolute time skew of the clock signals other than the reference clock signal based on the relative time skew; and a clock generator configured to adjust at least one phase of a clock signal among the clock signals based on the absolute time skew.

2. The analog-to-digital conversion circuit of claim 1, wherein the timing calibration circuit is further configured to generate the absolute time skew by removing a skew error from the relative time skew.

3. The analog-to-digital conversion circuit of claim 2, wherein the absolute time skew generator is further configured to generate the absolute time skew by multiplying at least one of a plurality of relative time skews respectively generated in relation to the ADCs by an error calibration matrix.

4. The analog-to-digital conversion circuit of claim 1, wherein the relative time skew has a positive value when the first correlation value is greater than the second correlation value, and the relative time skew has a negative value when the second correlation value is greater than the first correlation value.

5. The analog-to-digital conversion circuit of claim 4, wherein a size of the relative time skew is proportion to a difference between the first correlation value and the second correlation value.

6. The analog-to-digital conversion circuit of claim 1, wherein the first adjacent ADC receives a first clock signal among the clock signals, the target ADC receives a second clock signal among the clock signals, and the second adjacent ADC receives a third clock signal among the clock signals, the first clock signal has a relatively faster phase than the second clock signal, and the third clock signal has a relatively slower phase than the second clock signal.

7. The analog-to-digital conversion circuit of claim 6, wherein the relative time skew generator comprises:

a first relative time skew calculator that receives first data samples and generates a first relative time skew;

a second relative time skew calculator that receives first data samples and second data samples and generates a second relative time skew; and a third relative time skew calculator that receives second data samples and third data samples and generates a third relative time skew.

8. The analog-to-digital conversion circuit of claim 7, wherein the second relative time skew calculator comprises:

a first correlation operation circuit that performs operations on the first data samples and the second data samples to generate first correlation values;

a second correlation operation circuit that performs operations on the second data samples and the third data samples to generate second correlation values;

a subtraction circuit that performs a number of subtraction operations between respective the first correlation values and the second correlation values to generate subtraction results;

an accumulation & averaging circuit that accumulates the subtraction results to generate an accumulation result and divides the accumulation result by the number of subtraction operations to generate an average value; and a skew value generator that determines a second relative time skew based on the average value.

9. The analog-to-digital conversion circuit of claim 1, wherein the ADCs are N in number, where 'N' is a positive integer greater than 1, and the relative time skew generator includes N relative time skew calculators, wherein each of the relative time skew calculators provides a corresponding one of first to $N^{th}$ relative time skews, the absolute time skew generator is configured to generate first to $N^{th}$ absolute time skews, and the clock generator adjusts a phase of each one of the clock signals in response to the first to Nth absolute time skews.

10. The analog-to-digital conversion circuit of claim 9, wherein the clock generator comprises:

a delay control circuit that receives the first to $N^{th}$ absolute time skews, and generates first to $N^{th}$ delay control signals based on the first to $N^{th}$ absolute time skews; and a delay circuit that receives the reference clock signal and the first to $N^{th}$ delay control signals and respectively generates each of the clock signals by adjusting a phase of the reference clock signal.

11. The analog-to-digital conversion circuit of claim 1, wherein the clock generator comprises:

a delay control circuit configured to receive the absolute time skew and generate at least one delay control signal; and a delay circuit configured to adjust a phase of at least one of the clock signals in response to the at least one delay control signal.

12. A method of operating an analog-to-digital conversion circuit including N analog-to-digital converters (ADCs) wherein the ADCs include a target analog-to-digital converter (ADC) providing second data samples, a first adjacent ADC providing first data samples, and a second adjacent ADC providing third data samples, wherein 'N' is a positive integer greater than 1, and the ADCs are configured to perform analog-to-digital conversion using a time-interleaving approach in response to clock signals having different phases, the method comprising:

setting a value K less than N, where K identifies the target ADC among the ADCs;

(A) generating a relative time skew for the target ADC based on a first correlation value between respective first data samples and second data samples, and a second correlation value between respective second data samples and third data samples;

(B) adjusting a $K^{th}$ clock applied to the target ADC based on the relative time skew;

(C) determining whether K is equal to N; and if K is not equal to N, incrementing K and then sequentially repeating (A), (B) and (C), else if K is equal to N, generating absolute time skews of the clock signals based on relative time skews and an error calibration matrix, and adjusting phases of the clock signals based on the absolute time skews.

13. The method of claim 12, wherein generating of the absolute time skews of the clock signals comprises multiplying each of the relative time skews by the error calibration matrix.

14. The method of claim 12, wherein the generating of the relative time skew comprises:

performing first operations on respective first data samples and second data samples to generate first correlation values;

preforming second operations on respective second data samples and third data samples to generate second correlation values;

performing a number of subtraction operations between respective first correlation values and second correlation values to generate subtraction results;

accumulating the subtraction results to generate an accumulation result;

dividing the accumulation result by the number of subtraction operations to generate an average value; and determining the relative time skew based on the average value.

15. The method of claim 12, wherein the adjusting of the phases of the clock signals based on the absolute time skews comprises:

receiving the absolute time skews and generating delay control signals in response to the absolute time skews; and adjusting the phases of the clock signals using the delay control signals.

16. The method of claim 12, wherein the relative time skew has a positive value when the first correlation value is greater than the second correlation value, and the relative time skew has a negative value when the second correlation value is greater than the first correlation value.

17. The method of claim 16, wherein a size of the relative time skew is proportion to a difference between the first correlation value and the second correlation value.

18. A method of operating an analog-to-digital conversion circuit including N analog-to-digital converters (ADCs), wherein the ADCs include a target analog-to-digital converter (ADC) providing second data samples, a first adjacent ADC providing first data samples, and a second adjacent ADC providing third data samples, 'N' is a positive integer greater than 1, and the ADCs are configured to perform analog-to-digital conversion using a time-interleaving approach in response to clock signals having different phases, the method comprising:

setting a value K less than N, where K identifies the target ADC among the ADCs;

(A) generating a relative time skew for the target ADC;
(B) adjusting a $K^{th}$ clock applied to the target ADC based on the relative time skew;
(C) determining whether K is equal to N; and if K is not equal to N, incrementing K and then sequentially repeating (1), (2) and (3), else if K is equal to N, generating absolute time skews of the clock signals based on relative time skews and an error calibration matrix, and adjusting phases of the clock signals based on the absolute time skews, wherein the generating of the relative time skew for the target ADC comprises:

performing first correlation operations between second data samples and first data samples to generate first operation values;

performing second correlation operations between second data samples and third data samples to generate second operation values;

performing subtraction operations between the first operation values and the second operation values to generate subtraction values;

accumulating the subtraction values to generate an accumulation value; and averaging the accumulation value to generate an average value, wherein the relative time skew is determined in relation to the average value.

19. The method of claim 18, wherein each of the first correlation operations and each of the second correlation operations is a multiplication operation.

20. The method of claim 18, wherein a size of the relative time skew is proportion to differences between first correlation values derived from the first data samples and the second data samples and second correlation values derived from the second data samples and the third data samples.

* * * * *